US009891482B2

(12) United States Patent
Prushinskiy et al.

(10) Patent No.: US 9,891,482 B2
(45) Date of Patent: Feb. 13, 2018

(54) CURVED DISPLAY DEVICE (71) Applicant: Samsung Display Co., Ltd., Yongin-si, Gyeonggi-do (KR)

(72) Inventors: Valeriy Prushinskiy, Hwaseong-si (KR); Min Soo Kim, Seoul (KR); Cheol-Gon Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 62 days.

(21) Appl. No.: 14/960,659

(22) Filed: Dec. 7, 2015

(65) Prior Publication Data

US 2016/0216572 A1 Jul. 28, 2016

(30) Foreign Application Priority Data

Jan. 28, 2015 (KR) .................. 10-2015-0013368

(51) Int. Cl.
*G02F 1/136* (2006.01)
*G02F 1/1343* (2006.01)
*H01L 27/12* (2006.01)
*G02F 1/1362* (2006.01)

(52) U.S. Cl.
CPC ...... *G02F 1/134309* (2013.01); *H01L 27/124* (2013.01); *G02F 1/13624* (2013.01); *G02F 2001/134345* (2013.01)

(58) Field of Classification Search
CPC ......... G02F 1/133707; G02F 1/134309; G02F 1/1368; G02F 1/133305; G02F 1/134336; G02F 1/1362; G02F 1/136286; G02F 1/13624; G02F 1/1333; G02F 2001/134345; G02F 2201/123; G02F 2201/12; G02F 1/1343; H01L 51/0097; H01L 51/5203; H01L 27/3244; H01L 27/3262; H01L 27/3276; H01L 27/3297; G06F 2203/04102; G06F 3/0412; G06F 3/041; G09G 2300/04; G09G 2300/0426; G09G 2300/0443; G09G 2380/02; G09G 3/3677; G09G 3/3688; G09G 3/2074
USPC ............ 349/144, 43, 139, 143, 48, 146, 141
See application file for complete search history.

(56) References Cited

U.S. PATENT DOCUMENTS 7,368,307 B2    5/2008  Cok
2005/0206824 A1  9/2005  Son et al.
2009/0015776 A1* 1/2009  Lyu ....................... G02F 1/1337
                                              349/143

(Continued)

FOREIGN PATENT DOCUMENTS

KR    2005-0092544    9/2005
KR    2011-0046125    5/2011
KR    2011-0111227    10/2011

*Primary Examiner* — Thoi Duong
(74) *Attorney, Agent, or Firm* — H.C. Park & Associates, PLC (57) ABSTRACT A curved display device including a gate line and a first data line, a first switching element connected to the gate line and the first data line, and a first subpixel electrode connected to the first switching element and including a first horizontal stem part, a second horizontal stem part, and a vertical stem part, in which the first subpixel electrode includes a first sub region, a second sub region, a third sub region, and a fourth sub region which are divided by the first horizontal stem part, the second horizontal stem part, and the vertical stem part.

20 Claims, 7 Drawing Sheets (56) References Cited

U.S. PATENT DOCUMENTS

2011/0096282 A1    4/2011  Cho et al.
2016/0131953 A1*  5/2016  Xu ...................... H01L 27/1248
                                                       349/42

\* cited by examiner

CURVED DISPLAY DEVICE

CLAIM OF PRIORITY

This application claims priority to and the benefit of Korean Patent Application No. 10-2015-0013368 filed in the Korean Intellectual Property Office on Jan. 28, 2015, the entire contents of which are incorporated herein by reference.

BACKGROUND OF THE INVENTION

Field of the Invention

The present invention relates to a curved display device having improved wide angle viewing characteristics and reduced deterioration in transmittance upon bending by providing patterns in pixel electrodes that do not change upon a misalignment of the pixel electrodes due to bending of the curved display.

Description of the Related Art

A liquid crystal display, which is one of the most common types of flat panel displays currently in use, includes two sheets of display panels with field generating electrodes, such as a pixel electrode and a common electrode, formed thereon, and a liquid crystal layer interposed therebetween.

The liquid crystal display generates an electric field in a liquid crystal layer by applying a voltage difference between the field generating electrodes. The display also determines an orientation of liquid crystal molecules by the generated electric field and by a pattern in the pixel electrode, thereby controlling polarization of incident light so as to display images.

Among the liquid crystal displays, a liquid crystal display in a vertically aligned mode, in which a major axis of the liquid crystal molecule is aligned to be vertical to upper and lower display panels in a state where the electric field is not applied, has been in the limelight due to a high contrast ratio and an easy implementation of a wide reference viewing angle.

In the liquid crystal display in the vertically aligned (VA) mode, in order to implement a wide viewing angle, a plurality of domains having different alignment directions of the liquid crystals may be formed in one pixel. As a means for forming the plurality of domains as described above, a method of forming a cutout, such as a micro slit, in one of the field generating electrodes, a method of forming a protrusion on the one of the field generating electrodes, and the like are used. According to these methods, by a fringe field formed between an edge of the cutout or the protrusion and the other of the field generating electrodes that faces the edge of the cutout or the protrusion, the liquid crystals are aligned in a direction vertical to the fringe field, thereby forming a plurality of domains.

Meanwhile, recently, to increase viewer's immersion and realistic sensation, a curved display panel has been developed and a liquid crystal display adopting the curved display panel is getting the spotlight. In the case of the curved display panel, two display panels may be misaligned, which may result in deterioration of transmittance and a reduction in luminance.

The above information disclosed in this Background section is only for enhancement of understanding of the background of the invention and therefore it may contain information that does not constitute prior art under 35 U.S.C. §102.

SUMMARY OF THE INVENTION

The present invention has been made in an effort to provide a curved display device having advantages of minimizing deterioration in transmittance due to misalignment.

According to one aspect of the present invention, there is provided a curved display device, including a gate line and a first data line, a first switching element connected to the gate line and the first data line and a first subpixel electrode connected to the first switching element and including a first horizontal stem part, a second horizontal stem part, and a vertical stem part, wherein the first subpixel electrode may include a first sub region, a second sub region, a third sub region, and a fourth sub region divided by the first horizontal stem part, the second horizontal stem part, and the vertical stem part, the first horizontal stem part and the second horizontal stem part may be parallel to each other and each cross the vertical stem part, the second sub region and the third sub region may be arranged adjacent to each other in a row direction while each are bounded by the first horizontal stem part, the second horizontal stem part, and the vertical stem part in a plan view, the first sub region may be arranged above the third sub region in a column direction in a plan view while being bounded by the first horizontal stem part and the vertical stem part, and the fourth sub region may be arranged below the second sub region in the column direction in a plan view while being bounded by the second horizontal stem part and the vertical stem part.

Each of the first sub region, the second sub region, the third sub region, and the fourth sub region may include a plurality of fine branches. The fine branches of the first sub region may obliquely extend in an upper right direction in a plan view based on the vertical stem part from the first horizontal stem part and the vertical stem part. The fine branches of the second sub region may obliquely extend in an upper left direction in a plan view based on the vertical stem part from the second horizontal stem part and the vertical stem part. The fine branches of the third sub region may obliquely extend in a lower right direction in a plan view based on the vertical stem part from the first horizontal stem part and the vertical stem part. The fine branches of the fourth sub region may obliquely extend in a lower left direction in a plan view based on the vertical stem part from the second horizontal stem part and the vertical stem part.

The fine branches of the first sub region may be orthogonal to the fine branches of the third sub region, and wherein the fine branches of the second sub region may be orthogonal to the fine branches of the fourth sub region. The fine branches of the second sub region and the fine branches of the third sub region may extend in opposite directions from the vertical stem part. The fine branches of the second sub region and the fine branches of the third sub region may each be inclined at the same angle with respect to the first horizontal stem part or the second horizontal stem part. The curved display may also include a second switching element connected to the gate line and the first data line, a second subpixel electrode and a third switching element connected to the second switching element and a reference voltage line connected to the third switching element. The curved display device may also include wiring region, wherein the gate line, the reference voltage line, the first switching element, the second switching element, and the third switching element may be arranged within the wiring region, and wherein the first subpixel electrode and the second subpixel electrode may be spaced-apart from each other by the wiring region. The second subpixel electrode may have a shape in plan view corresponding to two first subpixel electrodes being attached to each other in the column direction.

The curved display device may also include a thud subpixel electrode arranged adjacent to the first subpixel electrode in a row direction in a plan view and having a structure that is a mirror image of the structure of the first subpixel electrode and a fourth subpixel electrode arranged adjacent to the second subpixel electrode in the row direction in a plan view and having a structure that is a mirror image of the structure of the second subpixel electrode. The curved display device may also include a second data line separated from the first data line, a second switching element connected to the gate line and to the second data line and a second subpixel electrode connected to the second switching element. The curved display device may also include a wiring region, wherein the gate line, the first switching element, and the second switching element may be arranged within the wiring region, and wherein the first subpixel electrode and the second subpixel electrode may be spaced-apart from each other by the wiring region. The second subpixel electrode may have a shape in a plan view corresponding to two first subpixel electrodes being attached to each other in the column direction.

The curved display device may instead include a third subpixel electrode arranged adjacent to the first subpixel electrode in the row direction in a plan view and having a structure that is a mirror image of the structure of the first subpixel electrode and a fourth subpixel electrode arranged adjacent to the second subpixel electrode in the row direction in a plan view and having a structure that is a mirror image of the structure of the second subpixel electrode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification.

In addition, the size and thickness of each configuration shown in the drawings are arbitrarily shown for understanding and ease of description, but the present invention is not limited thereto.

In the drawings, the thickness of layers, films, panels, regions, etc., are exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements. Further, in the specification, the word "on" means positioning on or below the object portion, but does not essentially mean positioning on the upper side of the object portion based on a gravity direction.

Further, in the specification, the term "in plan view" means when viewing the object portion from the top, and the term "in cross section" means when viewing a cross section taken by vertically cutting the object portion from the side.

Hereinafter, a curved display device according to an exemplary embodiment of the present invention will be described in detail with reference to the accompanying drawings.

Figure 1:
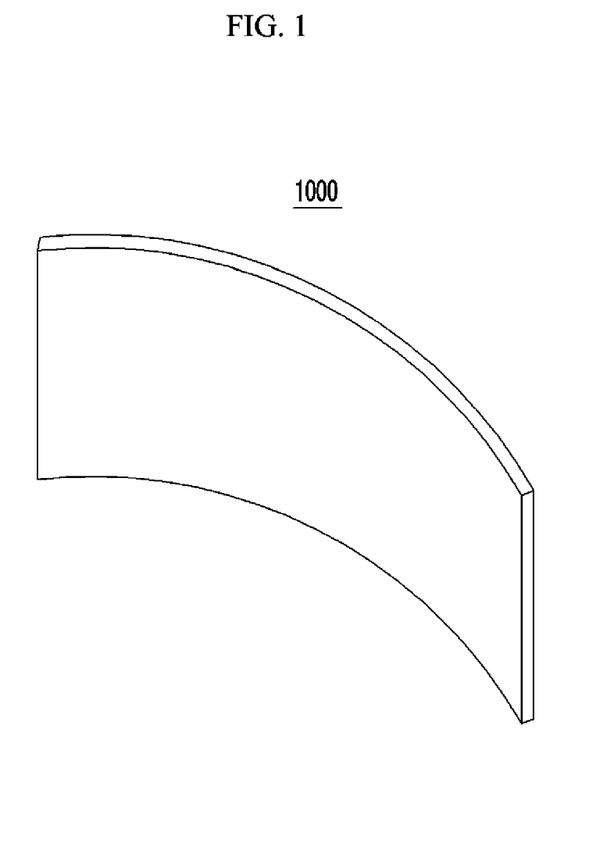
FIG. 1 is a schematic perspective view of a curved display device according to an exemplary embodiment of the present invention.

Turning now to FIG. 1, FIG. 1 is a schematic perspective view of a curved display device according to an exemplary embodiment of the present invention. Referring to FIG. 1, a curved display device 1000 according to an exemplary embodiment of the present invention may be curved in a horizontal direction which is a long axis, or curved in a vertical direction which is a short axis. The present exemplary embodiment describes the curved display device 1000, but is not limited thereto, and may be applied to a flat panel display. The curved display device 1000 includes a plurality of pixels for displaying an image.

Figure 2:
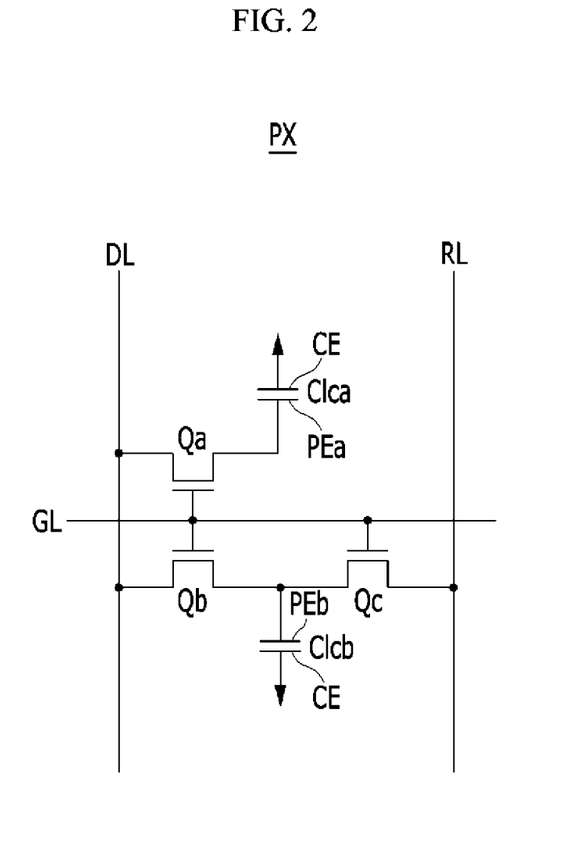
FIG. 2 is an equivalent circuit diagram of one pixel of the curved display device according to the exemplary embodiment of the present invention.

Turning now to FIG. 2, FIG. 2 is an equivalent circuit diagram of one pixel of the curved display device according to the exemplary embodiment of the present invention. Referring now to FIG. 2, one pixel PX of the curved display device of the present exemplary embodiment includes a plurality of signal lines including a gate line GL transferring a gate signal, a data line DL transferring a data signal, and a reference voltage line RL transferring a voltage dividing reference voltage, first, second, and third switching elements Qa, Qb, and Qc connected to the plurality of signal lines, and first and second liquid crystal capacitors Clca and Clcb.

The first and second switching elements Qa and Qb each are connected to the gate line GL and the data line DL, and the third switching element Qc is connected to the gate line GL, to an output terminal of the second switching element Qb and to the reference voltage line RL.

The first switching element Qa and the second switching element Qb are three-terminal elements, such as a thin film transistor, in which control terminals thereof are connected to the gate line GL, input terminals thereof are connected to the data line DL, an output terminal of the first switching element Qa is connected to the first liquid crystal capacitor Clca, and an output terminal of the second switching element Qb is connected to the second liquid crystal capacitor Clcb and an input terminal of the third switching element Qc.

The third switching element Qc is also the three-terminal element, such as the thin film transistor, in which a control terminal thereof is connected to the gate line GL, an input terminal thereof is connected to the second liquid crystal capacitor Clcb, and an output terminal thereof is connected to the reference voltage line RL.

The first liquid crystal capacitor Clca formed by using a first subpixel electrode PEa and a common electrode CE as two terminals, and a liquid crystal layer (not illustrated) portion between the two terminals as a dielectric material. The second liquid crystal capacitor Clcb is formed by using a second subpixel electrode PEb and the common electrode CE as two terminals, and a liquid crystal layer (not illustrated) portion between the two terminals as a dielectric material. Here, the first subpixel electrode PEa is connected to the output terminal of the first switching element Qa, and the second subpixel electrode PEb is connected to the output terminal of the second switching element Qb and an input of the third switching element Qc.

When a gate-on signal is applied to the gate line GL, the first switching element Qa the second switching element Qb, and the third switching element Qc are turned on. Therefore, a data voltage applied to the data line DL is applied to the first subpixel electrode PEa and the second subpixel electrode PEb through the first switching element Qa and the second switching element Qb respectively. In this case, the data voltages applied to the first subpixel electrode PEa and the second subpixel electrode PEb are the same as each other, leading one to believe that the first liquid crystal capacitor Clca and the second liquid crystal capacitor Clcb are charged with the same value which corresponds to a difference between a common voltage and the data voltage.

However, the voltage charged across the second liquid crystal capacitor Clcb is divided by the third switching element Qc, which is also turned on. As a result, the voltage value which is charged in the second subpixel electrode PEb of the second liquid crystal capacitor Clcb is lowered due to a difference between the common voltage and the voltage dividing reference voltage. That is, the voltage which is charged across the first liquid crystal capacitor Clca becomes higher than the voltage which charged across the second liquid crystal capacitor Clcb. As described above, the voltage charged across the first liquid crystal capacitor Clca and the voltage charged across the second liquid crystal capacitor Clcb becomes different from each other. Since the voltage across the first liquid crystal capacitor Clca and the voltage across the second liquid crystal capacitor Clcb are different from each other, angles at which liquid crystal molecules are inclined are different in the first subpixel electrode PEa than in the second subpixel electrode PEb, such that the first and second subpixel electrodes PEa and PEb have different luminances. Accordingly, when the voltage across the first liquid crystal capacitor Clca and the voltage across the second liquid crystal capacitor Clcb are appropriately controlled, an image viewed from a side may maximally approach an image viewed from a front, thereby improving side visibility.

In the illustrated exemplary embodiment of FIG. 2, the pixel PX includes the third switching element Qc connected between the second subpixel electrode PEb of the second liquid crystal capacitor Clcb and the voltage dividing reference voltage line RL in order to make the voltage charged across the second liquid crystal capacitor Clcb different from the voltage charged across the first liquid crystal capacitor Clca.

But the present invention is not limited thereto, the second liquid crystal capacitor Clcb may be connected to a step-down capacitor (not illustrated). Specifically, the pixel PX may include a third switching element Qc including a first terminal connected to a step-down gate line (not illustrated), a second terminal connected to the second subpixel electrode PEb of the second liquid crystal capacitor Clcb, and a third terminal connected to the step down capacitor (not illustrated), such that a part of the charges charged in the second liquid crystal capacitor Clcb are charged in the step-down capacitor, thereby differently setting charging voltages of the first liquid crystal capacitor Clca and the second liquid crystal capacitor Clcb.

Figure 3:
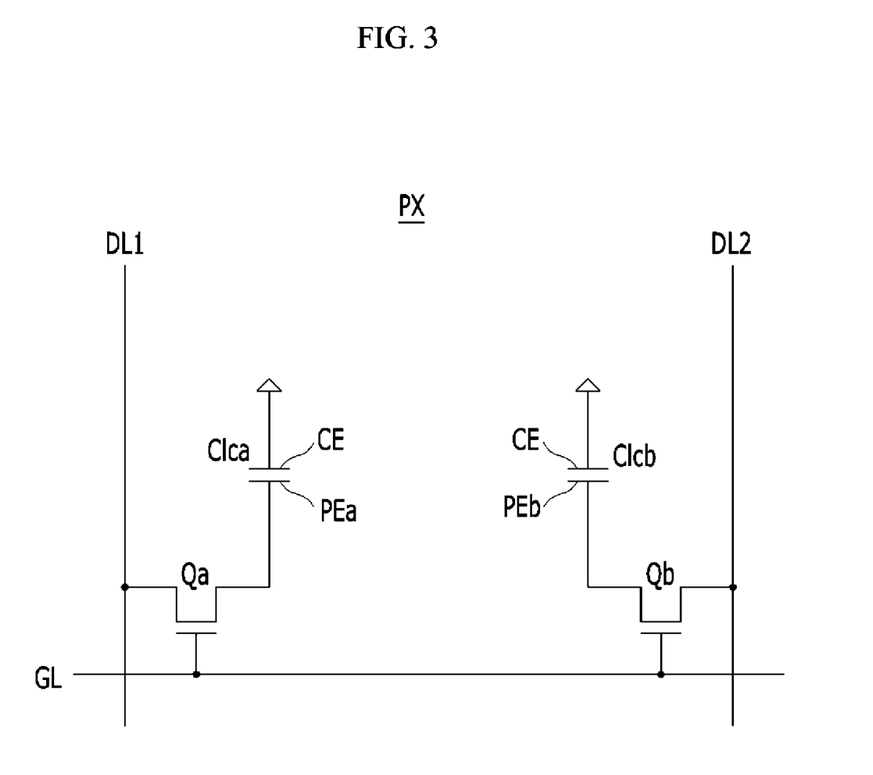
FIG. 3 is an equivalent circuit diagram of one pixel of a curved display device according to another exemplary embodiment of the present invention.

Further, in the case of a curved display device according to another exemplary embodiment of FIG. 3 of the present invention, the first liquid crystal capacitor Clca and the second liquid crystal capacitor Clcb may instead be connected to different data lines, respectively, and thus receive different data voltages, such that the charging voltage of the first liquid crystal capacitor Clca and the second liquid crystal capacitor Clcb may be differently set. Alternatively, the charging voltages of the first liquid crystal capacitor Clca and the second liquid crystal capacitor Clcb may be differently set by various other methods.

Turning now to FIG. 3, FIG. 3 is an equivalent circuit diagram of one pixel of a curved display device according to another exemplary embodiment of the present invention. Referring now to FIG. 3, one pixel PX of the liquid crystal display according to the second exemplary embodiment includes a plurality of signal lines including a gate line GL, and first and second data lines DL1 and DL2, first and second switching elements Qa and Qb connected to the plurality of signal lines, and first and second liquid crystal capacitors Clca and Clcb.

The first switching element Qa is connected to the gate line GL and the first data line DL1, and the second switching element Qb is connected to the gate line GL and the second data line DL2. The first and second switching elements Qa and Qb may be three-terminal elements such as a thin film transistor.

A control terminal of the first switching element Qa is connected to the gate line GL, an input terminal thereof is connected to the first data line DL1, and an output terminal thereof is connected to the pixel electrode PEa of the first liquid crystal capacitor Clca. A control terminal of the second switching element Qb is connected to the gate line GL, an input terminal thereof is connected to the second data line DL2, and an output terminal thereof is connected to the pixel electrode PEb of the second liquid crystal capacitor Clcb.

The first liquid crystal capacitor Clca is formed by using the first subpixel electrode PEa and a common electrode CE as two opposing terminals and a liquid crystal layer (not illustrated) portion between the two opposing terminals as a dielectric material. The second liquid crystal capacitor Clcb is formed by using a second subpixel electrode PEb and a common electrode CE as two opposing terminals and a liquid crystal layer (not illustrated) portion between the two opposing terminals as a dielectric material. Here, the first subpixel electrode PEa is connected to the output terminal of the first switching element Qa, and the second subpixel electrode PEb is connected to the output terminal of the second switching element Qb.

When a gate-on signal is applied to the gate line GL, the first switching element Qa and the second switching element Qb are turned on. As a result, a data voltage applied to the first data line DL1 is applied to the first subpixel electrode PEa through the first switching element Qa, and a data voltage applied to the second data line DL2 is applied to the second subpixel electrode PEb through the second switching element Qb.

In every occasion, the magnitude of the data voltage applied to the first subpixel electrode PEa is set to be higher or lower than the data voltage applied to the second subpixel electrode PEb. As described above, when voltages of the first and second liquid crystal capacitors Clca and Clcb are appropriately controlled, an image viewed from a side may approach an image viewed from a front, thereby improving side visibility of the liquid crystal display.

Figure 4:
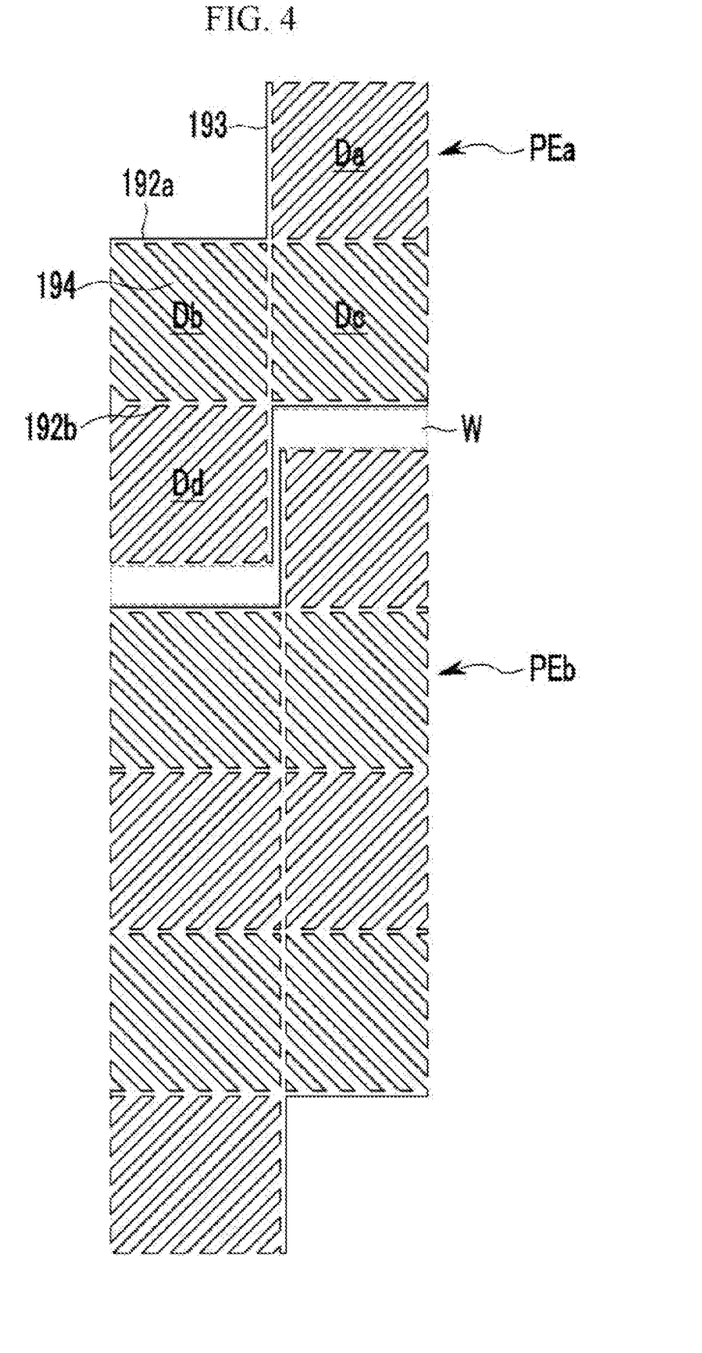
FIG. 4 is a diagram illustrating an example of shapes of first and second subpixel electrodes according to an exemplary embodiment of the present invention.

Turning now to FIG. 4, FIG. 4 is a diagram illustrating an example of shapes of first and second subpixel electrodes according to an exemplary embodiment of the present invention. Referring now to FIG. 4, the first subpixel electrode PEa and the second subpixel electrode PEb are separated from each other by a wiring region W therebetween.

The first subpixel electrode PEa includes a first horizontal stem part 192a, a second horizontal stem part 192b, and a vertical stem part 193. The first horizontal stem part 192a and the second horizontal stem part 192b are parallel to each other. Further, the first horizontal stem part 192a and the second horizontal stem part 192b each cross the vertical stem part 193.

The first subpixel electrode PEa is divided into a first sub region Da, a second sub region Db, a third sub region Dc, and a fourth sub region Dd by the first horizontal stem part 192a, the second horizontal stem part 192b, and the vertical stem part 193. Each of the first, second, third, and fourth sub regime Da, Db, Dc, and Dd includes a plurality of fine branches 194 which extend in parallel to each other. The second sub region Db and the third sub region Dc in a plan view are arranged adjacent to each other in a row direction, the first sub region Da in plan view is arranged on top of the third sub region Dc in a column direction, and the fourth sub region Dd in plan view is arranged below the second sub region Db in the column direction.

The first sub region Da is bounded by the first horizontal stem part 192a and the vertical stem part 193, and in a plan view, the fine branches 194 of the first sub region Da obliquely extend in an upper right direction based on the vertical stem part 193 from the first horizontal stem part 192a and the vertical stem part 193.

The second sub region Db is bounded by the first horizontal stem part 192a, the second horizontal stem part 192b, and the vertical stem part 193, and the fine branches 194 of the second sub region Db obliquely extend in an upper left direction in a plan view based on the vertical stem part 193 from the second horizontal stem part 192b and the vertical stem part 193. Further, some of the fine branches 194 of the second sub region Db are connected to the first horizontal, stem part 192a.

The third sub region Dc is bounded by the first horizontal stem part 192a, the second horizontal stem part 192b, and the vertical stem part 193, and in a plan view, the fine branches 194 of the third sub region Dc obliquely extend in a lower right direction based on the vertical stem part 193 from the first horizontal stem part 192a and the vertical stem part 193. Further, some of the fine branches 194 of the third sub region Dc are connected to the second horizontal stem part 192b.

The fourth sub region Dd is bounded by the second horizontal stem part 192b and the vertical stem part 193. In a plan view, the fine branch 194 of the fourth sub region Dd obliquely extend in a lower left direction based on the vertical stem part 193 from the second horizontal stem part 192b and the vertical stem part 193.

The fine branches 194 of the first, second, third and fourth sub regions Da, Db, Dc, and Dd each form an angle of about 45° or 135° with the first horizontal stem part 192a or the second horizontal stem part 192b. In a plan view, the fine branches 194 of two sub regions adjacent to each other in a column direction may be orthogonal to each other. Specifically, the fine branches 194 of the first sub region Da may be orthogonal to the fine branches 194 of the third sub region Dc, and the fine branches 194 the second sub region Db may be orthogonal to the fine branches 194 of the fourth sub region Dd.

In a plan view, the fine branches 194 of the second sub region Db and the third sub region Dc may be positioned on the same extension line. In other words, the line branches 194 of the second sub region Db and the third sub region Dc extend in opposite directions based on the vertical stem part 193. Further, the fine branches 194 of the second sub region Db and the third sub region Dc are each inclined by a same angle with respect to the first horizontal stem part 192a or the second horizontal stem part 192b.

In a plan view, the second subpixel electrode PEb has a shape corresponding to two first subpixel electrodes PEa being attached to each other in the column direction. Accordingly, in the second subpixel electrode PEb, taken in a plan view, the first sub region Da of one of the two first subpixel electrodes that make up the second subpixel electrode is arranged next to the fourth sub region Dd of an other of the two first subpixel electrodes that make up the second subpixel electrode in the row direction, and the second sub region Db of one of the two first subpixel electrodes that make up the second subpixel electrode is arranged below the fourth sub region Dd of an other of the two first subpixel electrodes that make up the second subpixel electrode in the column direction.

In the wiring region W of the pixel PX of FIG. 2, the gate line GL, the reference voltage line RL, and the first, second, and third switching elements Qa, Qb and Qc may be arranged. Alternatively, in the wiring region W of the pixel PX of FIG. 3, the gate line GL and the first and second switching elements Qa and Qb, may be arranged. In either case, the gate line L and the reference voltage line RL may be bent along the peripheral edges of the fourth sub region Dd and the third sub region Dc of the first subpixel electrode PEa.

Figure 5:
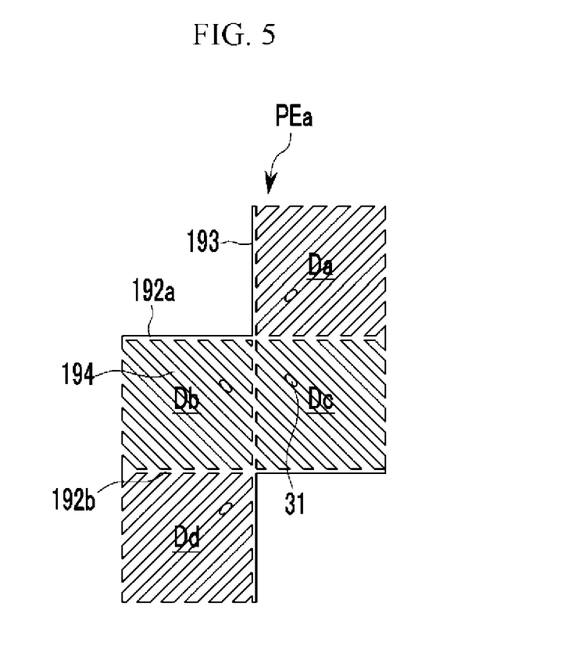
FIG. 5 is a diagram schematically illustrating alignment directions of liquid crystal molecules according to an exemplary embodiment of the present invention.

Turning now to FIG. 5, alignment directions of liquid crystal molecules according to an exemplary embodiment of the present invention will now be described. Referring now to FIG. 5, FIG. 5 is a diagram schematically illustrating alignment directions of liquid crystal molecules according to an exemplary embodiment of the present invention. As illustrated in FIG. 5, liquid crystal molecules 31 are aligned in directions in which the fine branches 194 of the sub regions Da, Db, Dc, and Dd extend.

The liquid crystal molecules 31 in the second sub region Db and in the third sub region Dc are each aligned in the same direction. Further, the alignment direction of the liquid crystal molecule 31 in the first sub region Da may be orthogonal to the alignment direction of the liquid crystal molecules 31 in each of the second sub region Db and the third sub region Dc. Furthermore, the alignment direction of the liquid crystal molecule 31 in the fourth sub region Dd may be orthogonal to the alignment direction of the liquid crystal molecules 31 in each of the second sub region Db and the third sub region Dc. As described above, when the directions in which the liquid crystal molecules 31 are aligned are varied, a reference viewing angle of the display device is increased.

Figure 6:
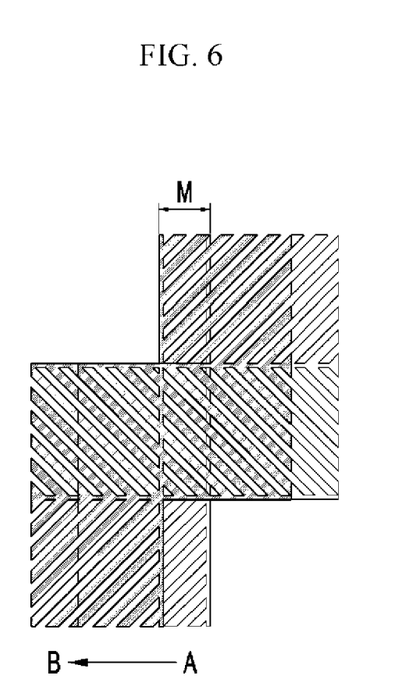
FIG. 6 is a diagram illustrating misalignment of a curved display device according to an exemplary embodiment of the present invention.

Hereinafter, misalignment of a curved display device according to an exemplary embodiment of the present invention will now be described with reference to FIG. 6. Turning now to FIG. 6, FIG. 6 is a diagram illustrating misalignment of the curved display device according to the exemplary embodiment of the present invention.

Referring now to FIG. 6, a pixel electrode of the curved display device according to the present exemplary embodiment moves from portion A to portion B due to bending to form a curved surface. As a result, misalignment portion M is generated. In this case, a direction of a fine branch electrode in misalignment portion M is the same as that of a fine branch electrode in portion A. That is, an alignment direction of liquid crystal molecules in misalignment portion M is the same as that of liquid crystal molecules in portion A. As described above, even though the misalignment occurs due to the curved surface, the alignment direction of the liquid crystal molecules in misalignment portion M is the same as that of the liquid crystal molecules before the misalignment occurs, thereby minimizing deterioration in transmittance. Accordingly, it is possible to minimize a reduction in luminance of the curved display device.

Figure 7:
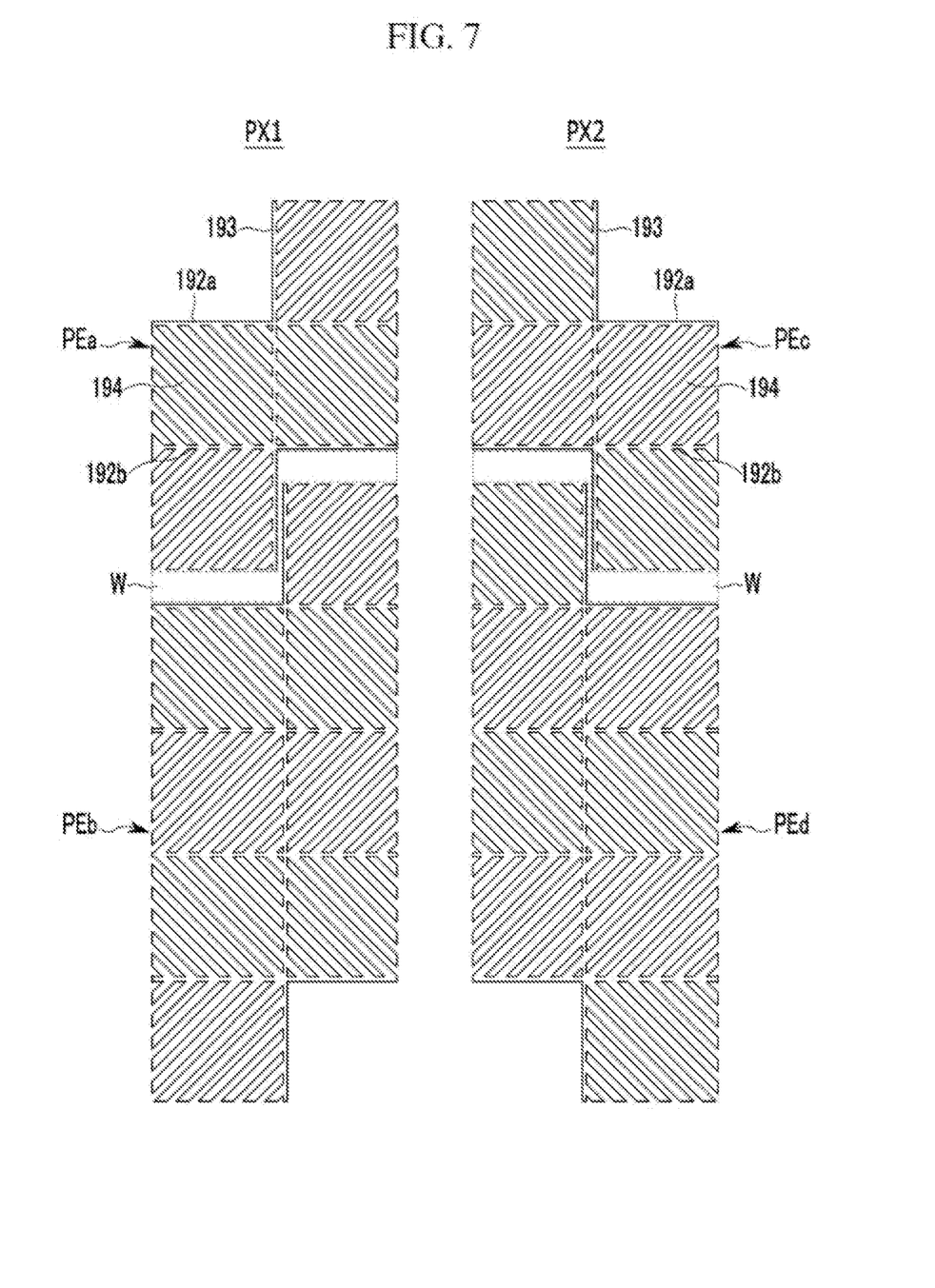
FIG. 7 is a diagram schematically illustrating a curved display device according to another exemplary embodiment of the present invention.

Hereinafter, a liquid crystal display according to another exemplary embodiment of the present invention will be described with reference to FIG. 7. Turning now to FIG. 7, FIG. 7 is a diagram schematically illustrating a curved display device according to another exemplary embodiment of the present invention.

Referring now to FIG. 7, the curved display device according to the present exemplary embodiment includes a first pixel PX1 and a second pixel PX2 that are positioned adjacent to each other in the row direction in a plan view. The first pixel PX1 includes a first subpixel electrode PEa, a second subpixel electrode PEb, and a wiring region W.

The first subpixel electrode PEa and the second subpixel electrode PEb are spaced-apart by the wiring region W. The first subpixel electrode PEa includes a first horizontal stem part 192a, a second horizontal stem part 192b, a vertical stem part 193, and fine branches 194. The second subpixel electrode PEb has a shape in a plan view corresponding to two first subpixel electrodes PEa being attached to each other in the column direction. The shapes of the first subpixel electrode PEa and the second subpixel electrode PEb are the same as those of the first and second subpixel electrodes according to the exemplary embodiment of FIG. 4. Therefore, the shapes of the first subpixel electrode PEa and the second subpixel electrode PEb of the first pixel PX1 according to the present exemplary embodiment will not be further described.

The second pixel PX2 includes a third subpixel electrode PEc, a fourth subpixel electrode PEd, and a wiring region W. Here, a pixel circuit for the second pixel PX2 may be the equivalent circuit illustrated in FIG. 2 or the equivalent circuit illustrated in FIG. 3. The third subpixel electrode PEc and the fourth subpixel electrode PEd are spaced-apart from each other by the wiring region W. The third subpixel electrode PEc includes a first horizontal stem part 192a, a second horizontal stem part 192b, a vertical stem part 193, and fine branches 194. The fourth subpixel electrode PEd has a shape corresponding to two third subpixel electrodes PEc being attached to each other in the column direction in a plan view.

Here, the third subpixel electrode PEc has a structure that is reflectionally symmetric with respect to the structure of the first subpixel electrode PEa, and the fourth subpixel electrode PEd has a structure which is reflectionally symmetric with respect to the structure of the second subpixel electrode PEb. In other words, the third subpixel electrode PEc is a mirror image of the first subpixel electrode PEa, while the fourth pixel electrode PEd is a mirror image of the second pixel electrode PEb.

While this invention has been described in connection with what is presently considered to be practical exemplary embodiments, it is to be understood that the invention is not limited to the disclosed embodiment, but, on the contrary, is intended to cover various modifications and equivalent arrangements included within the spirit and scope of the appended claims.

DESCRIPTION OF SYMBOLS

Clca, Clcb: First and second liquid crystal capacitors
GL: Gate line
DL: Data line
DL1, DL2: First and second data lines
RL: Reference voltage line
PEa, PEb, PEc, PEd: First, second, third, and fourth subpixel electrodes
Qa, Qb, Qc: First, second, and third switching elements
192a, 192b: First and second horizontal stem parts
193: Vertical stem part
194: Fine branch

What is claimed is:
1. A curved display device, comprising:
a gate line and a first data line;
a first switching element connected to the gate line and the first data line; and
a first subpixel electrode connected to the first switching element and including a first horizontal stem part, a second horizontal stem part, and a vertical stem part, wherein the first subpixel electrode includes a first sub region, a second sub region, a third sub region, and a fourth sub region divided by the first horizontal stem part, the second horizontal stem part, and the vertical stem part, the first horizontal stem part and the second horizontal stem part are parallel to each other and each cross the vertical stem part;
the second sub region and the third sub region are arranged adjacent to each other in a row direction while each are bounded by the first horizontal stem part, the second horizontal stem part, and the vertical stem part in a plan view,
the first sub region being arranged above the third sub region in a column direction in a plan view while being bounded by the first horizontal stem part and the vertical stem part, and
the fourth sub region being arranged below the second sub region in the column direction in a plan view while being bounded by the second horizontal stem part and the vertical stem part.
2. The curved display device of claim 1, wherein each of the first sub region, the second sub region, the third sub region, and the fourth sub region includes a plurality of fine branches.

3. The curved display device of claim 2, wherein the fine branches of the first sub region obliquely extend in an upper right direction in a plan view based on the vertical stem part from the first horizontal stem part and the vertical stem part.

4. The curved display device of claim 3, wherein the fine branches of the second sub region obliquely extend in an upper left direction in a plan view based on the vertical stem part from the second horizontal stem part and the vertical stem part.

5. The curved display device of claim 4, wherein the fine branches of the third sub region obliquely extend in a lower right direction in a plan view based on the vertical stem part from the first horizontal stem part and the vertical stem part.

6. The curved display device of claim 5, wherein the fine branches of the fourth sub region obliquely extend in a lower left direction in a plan view based on the vertical stem part from the second horizontal stem part and the vertical stem part.

7. The curved display device of claim 6, wherein the fine branches of the first sub region are orthogonal to the fine branches of the third sub region, and wherein the fine branches of the second sub region are orthogonal to the fine branches of the fourth sub region.

8. The curved display device of claim 7, wherein the fine branches of the second sub region and the fine branches of the third sub region extend in opposite directions from the vertical stem part.

9. The curved display device of claim 8, wherein the fine branches of the second sub region and the fine branches of the third sub region each are inclined at the same angle with respect to the first horizontal stem part or the second horizontal stem part.

10. The curved display device of claim 9, further comprising:
    a second switching element connected to the gate line and the first data line;
    a second subpixel electrode and a third switching element connected to the second switching element; and
    a reference voltage line connected to the third switching element.

11. The curved display device of claim 10, further comprising a wiring region, wherein the gate line, the reference voltage line, the first switching element, the second switching element, and the third switching element are arranged within the wiring region, and wherein the first subpixel electrode and the second subpixel electrode are spaced-apart from each other by the wiring region.

12. The curved display device of claim 11, wherein the second subpixel electrode has a shape in a plan view corresponding to two first subpixel electrodes being attached to each other in the column direction.

13. The curved display device of claim 12, further comprising:
    a third subpixel electrode arranged adjacent to the first subpixel electrode in a row direction in a plan view and having a structure that is a mirror image of the structure of the first subpixel electrode; and
    a fourth subpixel electrode arranged adjacent to the second subpixel electrode in the row direction in a plan view and having a structure that is a mirror image of the structure of the second subpixel electrode.

14. The curved display device of claim 9, further comprising:
    a second data line separated from the first data line;
    a second switching element connected to the gate line and to the second data line; and
    a second subpixel electrode connected to the second switching element.

15. The curved display device of claim 14, further comprising a wiring region, wherein the gate line, the first switching element, and the second switching element are arranged within the wiring region, and wherein the first subpixel electrode and the second subpixel electrode are spaced-apart from each other by the wiring region.

16. The curved display device of claim 15, wherein the second subpixel electrode has a shape in a plan view corresponding to two first subpixel electrodes being attached to each other in the column direction.

17. The curved display device of claim 16, further comprising:
    a third subpixel electrode arranged adjacent to the first subpixel electrode in the row direction in a plan view and having a structure that is a mirror image of the structure of the first subpixel electrode; and
    a fourth subpixel electrode arranged adjacent to the second subpixel electrode in the row direction in a plan view and having a structure that is a mirror image of the structure of the second subpixel electrode.

18. The curved display device of claim 2, wherein each of the first through fourth sub regions of the first subpixel electrode have a same size and a same shape.

19. The curved display device of claim 2, wherein when the display device is curved, a misalignment portion is generated, and an orientation of liquid crystal molecules in the misalignment portion is the same as that of the liquid crystal molecules before misalignment occurs by having the minute branches of two different sub regions of the first subpixel electrode that are arranged adjacent to each other and on a same row being orientated in a same direction.

20. The curved display device of claim 2, further comprising a second subpixel electrode spaced apart from the first subpixel electrode by a wiring region, wherein the second subpixel electrode has a shape in a plan view corresponding to two first subpixel electrodes being attached to each other in the column direction.

* * * * *